United States Patent [19]

Giessen et al.

[11] Patent Number: 5,677,265
[45] Date of Patent: Oct. 14, 1997

[54] PROCESS FOR OXYGENATION OF CERAMIC HIGH $T_c$ SUPERCONDUCTORS

[75] Inventors: Bill C. Giessen, Cambridge; Robert S. Markiewicz, Lexington; Bala Maheswaran, Malden; Thomas R. Gilbert, Norfolk, all of Mass.

[73] Assignee: Northeastern University, Boston, Mass.

[21] Appl. No.: 398,289

[22] Filed: Mar. 3, 1995

[51] Int. Cl.$^6$ .................... C04B 35/638; C04B 35/76
[52] U.S. Cl. .................... 505/482; 505/320; 505/325; 505/400; 505/401; 505/728; 505/285; 252/521
[58] Field of Search .................... 505/320, 325, 505/400, 401, 430, 481, 482, 728, 785; 252/518, 521

[56] References Cited

U.S. PATENT DOCUMENTS

| | | | |
|---|---|---|---|
| 4,608,316 | 8/1986 | Toda et al. | 428/446 |
| 4,720,400 | 1/1988 | Manniso | 427/243 |
| 4,777,153 | 10/1988 | Sonuparlak et al. | 501/82 |
| 4,892,861 | 1/1990 | Ray | 505/1 |
| 4,916,114 | 4/1990 | Hoenig | 505/1 |
| 4,942,151 | 7/1990 | Capone et al. | 505/1 |
| 4,975,411 | 12/1990 | Dauby et al. | 505/1 |
| 4,992,415 | 2/1991 | Ashok et al. | 505/1 |
| 5,063,200 | 11/1991 | Okada et al. | 505/1 |
| 5,087,605 | 2/1992 | Hegde et al. | 505/1 |
| 5,110,789 | 5/1992 | Yamaguchi et al. | 505/1 |
| 5,120,707 | 6/1992 | Maxfield et al. | 205/1 |
| 5,132,278 | 7/1992 | Stevens et al. | 505/1 |
| 5,145,835 | 9/1992 | Tekeshita et al. | 505/1 |
| 5,158,837 | 10/1992 | Misawa et al. | 429/34 |
| 5,180,706 | 1/1993 | Reick | 505/1 |
| 5,180,707 | 1/1993 | Gao et al. | 505/1 |
| 5,219,832 | 6/1993 | Zhou | 505/1 |
| 5,248,661 | 9/1993 | Mole et al. | 505/1 |
| 5,252,545 | 10/1993 | Landingham | 505/1 |

FOREIGN PATENT DOCUMENTS 9004856  5/1990  WIPO.

OTHER PUBLICATIONS

G. Taubes, "Holding the Lines in High–Temperature Superconductors", *Science* 261:1521, Sep. 17, 1993.

P. Yam, "Trends in Superconductivity: Current Events", *Scientific American*, pp. 119–126, Dec. 1993.

Adrian et al., "The New Superconductors: Chemistry & Physics Converge to Pin Down Mechanisms", C&EN, pp. 24–40, Dec. 21, 1992.

R. Cava, "Superconductors Beyond 1–2–3", *Scientific American*, pp. 42–49, Aug., 1990.

*Primary Examiner*—Paul Lieberman
*Assistant Examiner*—Mark Kopec
*Attorney, Agent, or Firm*—Weingarten, Schurgin, Gagnebin & Hayes LLP

[57] ABSTRACT

A process for the oxygenation of ceramic high $T_c$ superconductors is disclosed. The superconductor is formed from a sintered powdered ceramic. Microchannels are formed in the ceramic material by embedding in the powder a plurality of wires or fibers formed of a material which is thermally removable during the sintering process to leave thin, continuous, tubular channels. After sintering, the ceramic is exposed to oxygen in a high temperature, high pressure environment. The microchannels aid in the transport of oxygen into the interior of the material by providing passages along which the oxygen travels prior to diffusing into the material. The lengths of the diffusion paths in the material are thereby greatly shortened. In another embodiment, the channels are formed after sintering and prior to oxygenation by drilling, punching, or etching.

18 Claims, 4 Drawing Sheets

PROCESS FOR OXYGENATION OF CERAMIC HIGH $T_C$ SUPERCONDUCTORS

FIELD OF THE INVENTION

This invention relates to the field of superconductors and more particularly to oxygenation of ceramic high $T_c$ superconductors.

BACKGROUND OF THE INVENTION

A class of superconductors having superconducting transition temperatures, $T_c$, of approximately 90 K or greater has been developed. Such high temperatures allow these superconductors to be cooled more economically through the use of liquid nitrogen, which has a boiling temperature of 77 K. One class of these superconductors (known as "RBCO") are ceramics having the following general formula:

$$RBa_2Cu_3O_x$$

in which R is one or more rare earth elements or yttrium and x ranges from 6 to 7. Certain properties, such as current density, of single crystals of these materials are anisotropic. For example, with $YBa_2Cu_3O_x$ (known as "123" or "YBCO"), current is carried within a preferred plane, the a-b plane, more readily than along the c axis perpendicular to the a-b plane. Accordingly, achieving proper crystal orientation during fabrication of these materials is important.

It has been difficult to get superconductors to carry large currents. Single crystal sheets of ceramic work reasonably well, but are expensive to fabricate. Thin films, which retain crystal orientation, are not suitable for bulk current carrying applications. Thick films tend to lose crystal orientation, introducing grain boundaries which can hinder the flow of current. Grain boundaries which are misaligned by more than about 10° have very low critical currents ("weak links").

A process for aligning crystals for bulk current carrying applications has been disclosed in U.S. Pat. No. 5,114,905. This process provides a dense material having well aligned grains, with good contact and a low number of voids between grains, which is helpful to current flow.

However, the increased density and decreased void volume raise a problem for the class of high temperature superconductors such as $YBa_2Cu_3O_x$ which require oxygenation after sintering. Properties such as the superconducting transition temperature and critical magnetic field depend on the oxygen content. In preparing superconductors of this type, a powder comprising barium, copper, and one or more rare earth elements or yttrium is compressed and sintered. Subsequently, oxygen is diffused into the sintered material until the correct stoichiometry, $x \cong 7.0$, is achieved. However, the oxygen diffusion rates for these materials can be prohibitively slow.

Oxygenation proceeds from the surface to the interior, either parallel to the c-axis or along the a-b planes. However, the oxygen diffusion rate parallel to the c axis may be as much as 100,000 times lower than along the a-b planes. Thus, if the material is formed as a slab or ribbon having a preferred a-b plane alignment, most of the oxygen diffusion occurs along the a-b planes. Hence, the size of the a-b plane determines the time to completely oxygenate the sample. Even along the a-b planes, however, the diffusion rates can be excessively slow. For example, at 500° C., $D_{ab}$=1.16× $10^{-10}$ cm²/s for 123. Oxygenation of a material having a 10 mm width in the a-b plane would require approximately 74 years. The diffusion constant is a strong function of temperature, so this time can be reduced to 1.34 years by annealing the material at 700° C., where $D_{ab}$=6.43×$10^{-9}$ cm²/s. However, the equilibrium oxygen content in 123 is a strongly decreasing function of temperature at fixed oxygen pressure, so the oxygen annealing would have to be carried out at high oxygen pressures of approximately 100 atm.

One attempt to facilitate oxygen transport in 123 superconductors has incorporated silver into the material, since silver transports $O_2$ reasonably well. In particular, 5 to 15 percent silver has been added as a powder which disperses throughout the material during sintering, forming isolated silver globules. However, the diffusion rate in the c-axis direction is not greatly improved by this approach, since the globules do not form a connected network. Also, the silver globules may separate grains and thereby provide additional weak-coupling Josephson junctions. Accordingly, achieving oxygenation of high temperature superconductors of this class without loss of superconductivity is still limiting the use of these materials, particularly in bulk current carrying applications.

SUMMARY OF THE INVENTION

The present invention provides a process for increasing the transport of oxygen into high $T_c$ ceramic superconductors. Thin continuous paths or microchannels from the surface to the interior are formed in the material. The microchannels aid in the transport of oxygen into the interior of the material by providing passages along which the oxygen travels prior to diffusing into the material. In this manner, the lengths of the diffusion paths in the a-b planes are greatly shortened and the need for oxygen diffusion along the c-axis eliminated or significantly reduced, thereby bypassing the problem of low diffusion rates.

In one embodiment, thin wires or fibers of a thermally removable material are embedded in a slab or ribbon of powdered superconductor material. During sintering, the wires or fibers melt, evaporate, or burn, leaving thin, continuous microchannels from the surface to the interior. The microchannels are used for subsequent oxygenation of the superconductor. Preferably, the wires or fibers comprise silver, a silver-based alloy, or carbon, although other materials that can be thermally removed may also be used.

In an alternative embodiment, the microchannels are provided by drilling, punching, or etching an array of suitably spaced, small diameter holes through the superconductor material. The drilling may be done, for example, by laser drilling, electron beam drilling, or ultrasonic drilling. In this embodiment, the holes may be formed after sintering.

While the invention is particularly advantageous when applied to biaxially aligned pellets, the invention is not limited to such materials. The microchannels of the invention can also greatly enhance oxygen transport in any highly dense superconducting material, such as melt-regrown samples.

DESCRIPTION OF THE DRAWINGS

The invention will be more fully understood from the following detailed description taken in conjunction with the accompanying drawings in which:

FIG. 3b is a scanning electron micrograph at 3,000× magnification of the material of FIG. 3a.

DETAILED DESCRIPTION OF THE INVENTION

In the present invention, crystal grains of an $RBa_2Cu_3O_x$ superconductor material comprising copper, barium, and one or more rare earth elements or yttrium are provided. The rare earth elements may comprise any of the rare earth elements (cerium, praseodymium, neodymium, promethium, samarium, europium, gadolinium, terbium, dysprosium, holmium, erbium, thulium, ytterbium, lutetium), although cerium and terbium, which do not form the 123 type phase, praseodymium, which has not been found to yield a superconductor, and promethium, which is not naturally occurring, are not typically used. The grains are provided in a powdered or other form, such as a liquid slurry with an organic binder.

Figure 1:
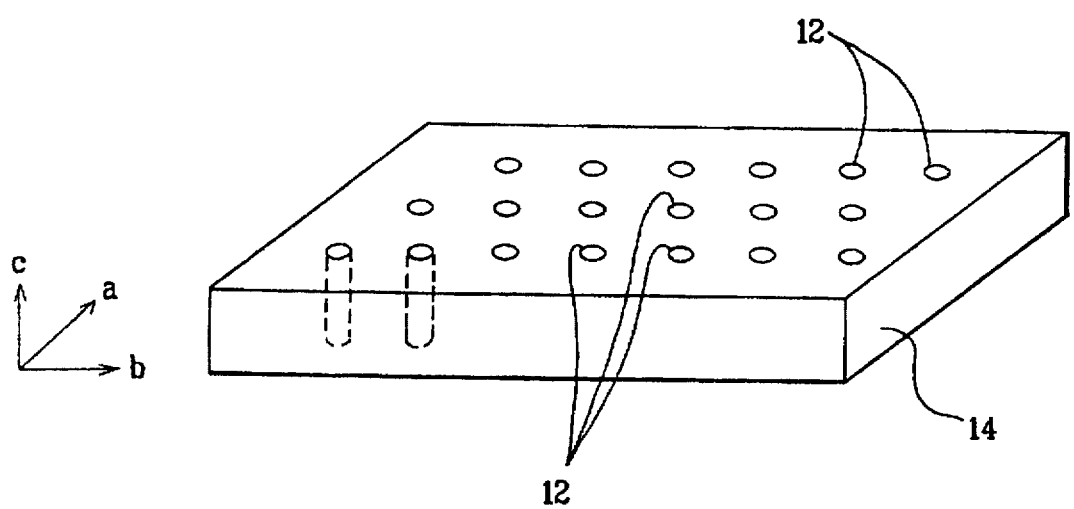
FIG. 1 is a schematic diagram of a material in preparation according to the process of the present invention.

As shown schematically in FIG. 1, thin wires or fibers 12 are embedded in the superconductor material, which is shaped as a slab or ribbon 14 having a narrow thickness along the c axis relative to the length and width in the a-b plane. The c-axis thickness typically ranges from 200 μm to 5 mm. The dimensions in the a-b plane range from 2 mm to 10 mm in width, whereas the length, which is determined by the application, may be much greater. While this shape and these dimensions are typical, the invention is not limited to any particular shape or dimensional ratios. In the case of biaxially aligned materials such as are described in U.S. Pat. No. 5,114,905, the disclosure of which is incorporated herein by reference, the crystals are oriented to provide the preferred crystal alignment with respect to both an axis perpendicular to a desired plane and an axis lying within this plane by application of a force or forces appropriate to the anisotropic properties of the particular material. In this case, for example, the rare earth constituents provide the crystals with a magnetic moment, such that an applied magnetic field orients the crystals along the axis lying within the desired plane.

Next, the material is consolidated and sintered. The thin wires or fibers embedded in the superconductor slab or ribbon are formed of a material which is thermally removable during the sintering process, such as by melting into the surrounding environment, evaporation, or combustion. After the wires or fibers are thermally removed, thin, continuous microchannels from the surface to the interior remain in their place. Preferably, at least one-third of the wires or fibers are aligned generally parallel to the c-axis of the material, so that at least one-third of the resulting microchannels are also aligned generally parallel to this axis.

The material is subsequently oxygenated, by heating at a predetermined temperature and pressure in an atmosphere including oxygen, to provide the stoichiometric amount of oxygen to the material. The microchannels aid in the transport of the oxygen into the interior of the material by providing passages along which the oxygen travels prior to diffusing into the material. The microchannels along the c-axis are particularly effective in delivering oxygen from the surface to the interior of the material for diffusion along the a-b planes and for shortening the length of the diffusion paths within the a-b planes.

The wires or fibers may be provided in a geometric array as a brush or as a woven, carpet-like mesh, having spaced vertical wires supported in a horizontal structure of wires. Preferably, the wires are spaced apart by a distance four to six times the diameter of the wires. The vertical wires are preferably aligned with the c-axis. Alternatively, fibers may be provided in tows or as a matte having a random fiber orientation.

Silver has been found to be a suitable material for the wires. Silver's melting temperature of 961° C. or 1234 K is less than the typical sintering temperatures of high $T_c$ superconducting materials. When embedded within the superconductor material, the silver melts into the material at a temperature of 20° C. or more below silver's melting temperature, leaving empty microchannels in its absence. Also, since silver is a good oxygen transport medium, the silver is available to further assist oxygen transport in the a-b planes by connecting adjacent grains of the material. Further, silver has the additional advantage that, after melting, it acts as a flux to facilitate superconductor grain growth needed for creating high current carrying cross-sections. Alloys of silver, such as lower melting silver-copper or higher melting silver-palladium, silver-gold, or silver-platinum alloys, may also be used.

The silver or silver-based alloy wires may have a diameter of approximately 25 micrometers and may be spaced 100 micrometers apart, thus occupying only approximately 5 percent of the volume of the superconductor. After disappearing, the wires leave tubular channels of approximately the same diameter as the wires. Thus, the areas of the microchannels do not significantly reduce the superconductor cross-section and hence the critical current. Oxygenation is then carried out by placing the material in an $O_2$ atmosphere at appropriate temperatures and pressures. For RBCO, the temperature is at least 400° C. and the pressure is at least 1 atm. Preferably, the temperature is at least 700° C. and the pressure at least 100 atm. At this temperature and pressure, oxygen is transported a distance of 100 micrometers in the material in approximately only 10 hours.

In addition to silver or silver-based alloy wires, carbon fibers, combustible polyacrylonitrile fibers, or other materials capable of being thermally removed may be used. Graphite fibers may have a smaller diameter, approximately 1 to 5 micrometers, than silver wires, resulting in narrower microchannels. The carbon fibers may also be coated, for example, with carbide. Alternatively, silver-plated tungsten or molybdenum wires may be used. Such silver-plated wires may not fully thermally decompose, but may be subsequently removed by, for example, mechanical extraction made possible by the silver plating, which itself melts and provides a lubricating film around the wire. At temperatures below silver's melting temperature of 961° C. or 1234 K, a second coating, such as of tin or lead, may be used. Tin and lead have melting temperatures of 505 K and 601 K, respectively.

In a further embodiment, the silver wires may be left in the holes as an oxygen transport medium. In this case, the silver must survive the sintering temperatures which are generally greater than silver's melting temperature, and thus must be kept from forming globules by spheroidizing. To prevent spheroidizing, the silver or a silver-copper or other alloy combination may be plated on a spine such as tungsten, tantalum, or any other metal wetted by the plated metal. Alternatively, silver-palladium or other higher melting silver alloys may be used.

In a still further embodiment, the microchannels may be provided by drilling or punching an array of suitably spaced, small diameter holes through the slab generally parallel to the c-axis. For example, the holes may be formed by laser, electron beam, or ultrasonic drilling, which may be performed after sintering and prior to oxygenation. In another embodiment, the microchannels may be provided by electrolytic etching after sintering.

The present invention has been tested as indicated by the following examples.

EXAMPLE 1

Figure 2A:
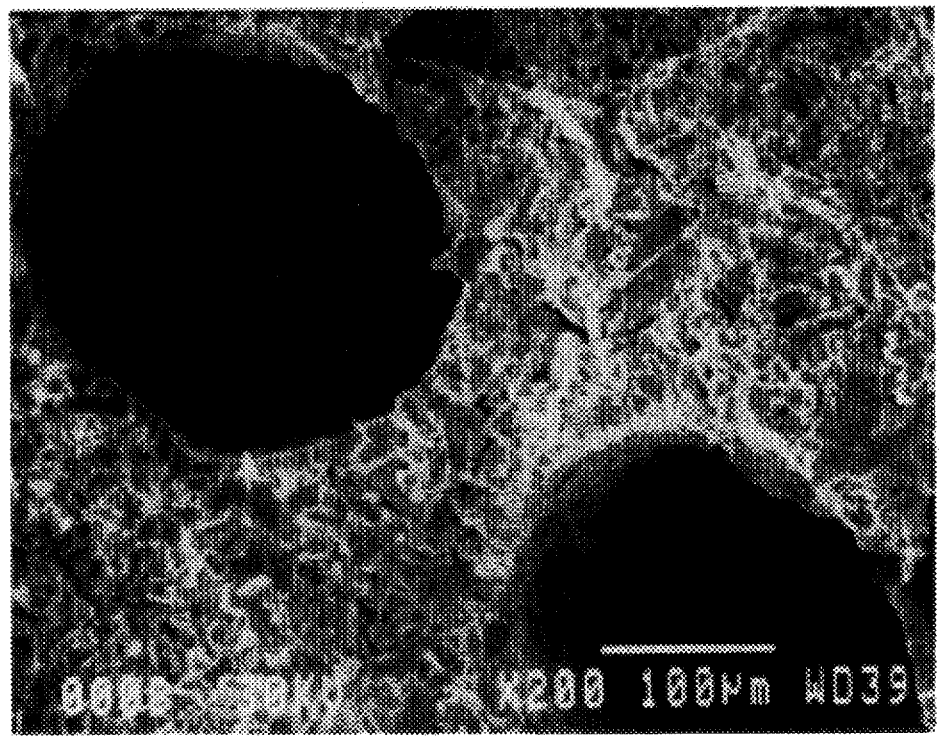
FIG. 2a is a scanning electron micrograph at 200× magnification of a ceramic high $T_c$ superconducting material employing silver wires according to the present invention after heating at 920° C. and 950° C.

In the first example, a mesh of silver wires was embedded in a powder of $YBa_2Cu_3O_x$ superconductor. The wires had a diameter of 250 μm. The powder was compacted and sintered at various temperatures and subsequently examined for the presence of microchannels. The sample was first raised to 920° C. and held for 2 hours. The silver had melted and microchannels were present. The sample was again heated to 920° C. and held at that temperature for 20 hours. The microchannels were still present and intact. The sample was then heated to 950° C. and held at that temperature for 15 hours. Again, the microchannels were still present and intact, as shown in the scanning electron micrograph at a magnification of 200× shown in FIG. 2a.

Figure 2B:
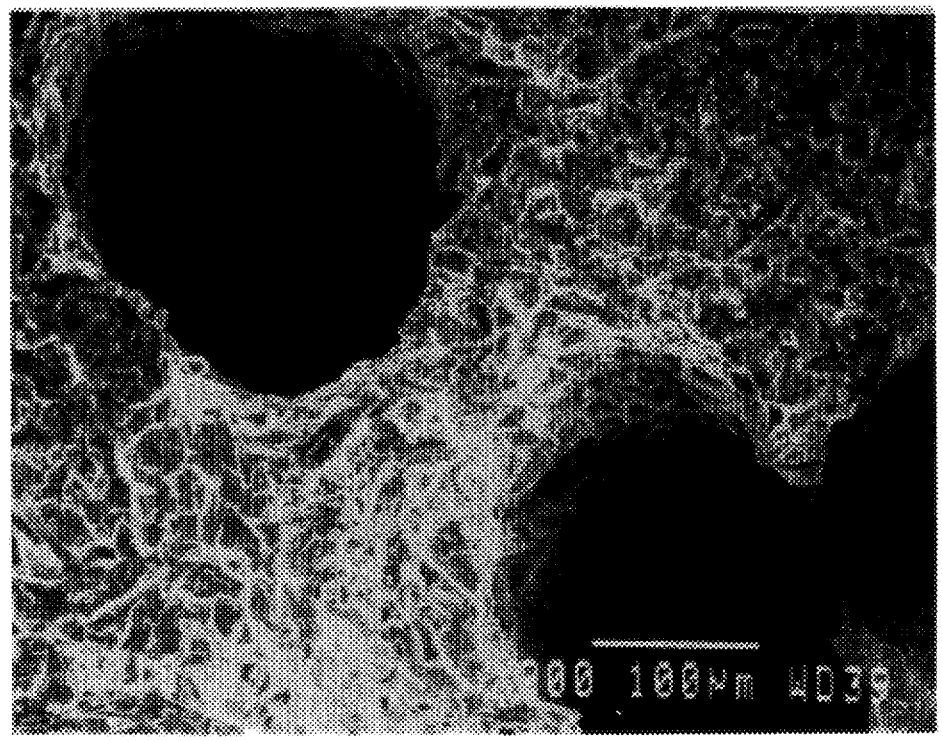
FIG. 2b is a scanning electron micrograph at 200× magnification of the material of FIG. 2a after additional heating at 980° C.

The sample was further heated to a temperature of 980° C. for 15 hours and is shown in FIG. 2b at a magnification of 200×. The microchannels are still visible.

Figure 2C:
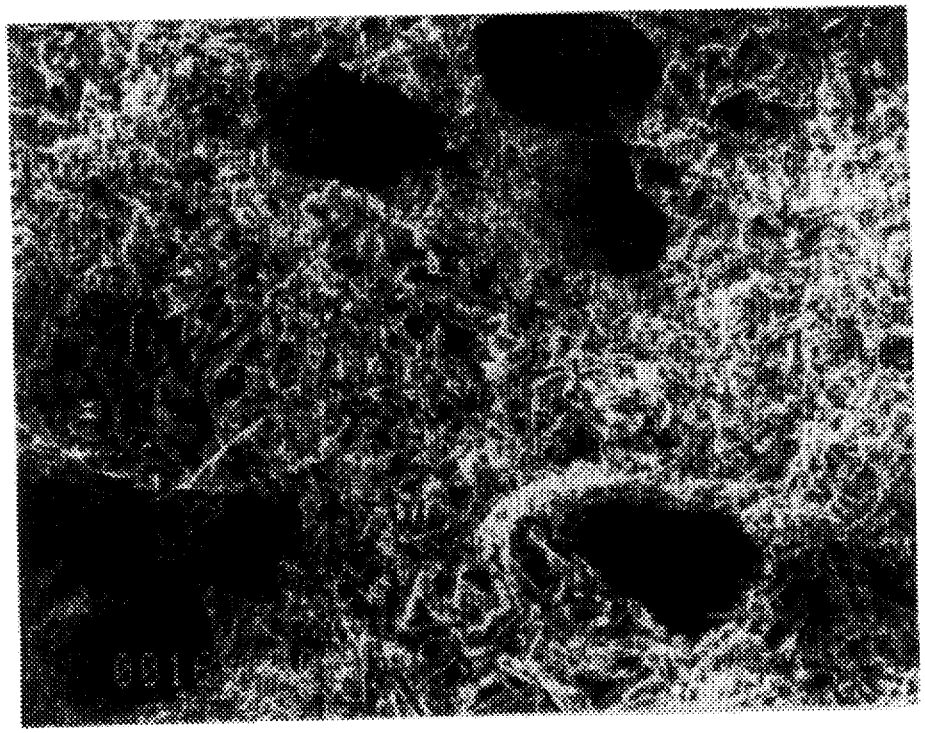
FIG. 2c is a scanning electron micrograph at 80× magnification of the material of FIGS. 2a and 2b after additional heating at 1000° C.
Figure 2D:
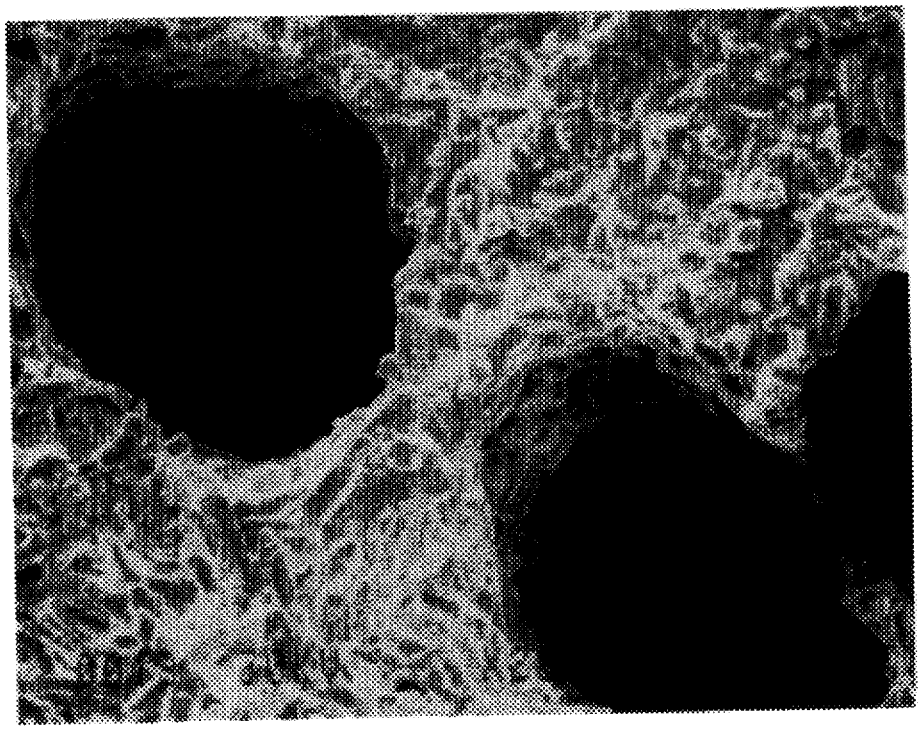
FIG. 2d is a scanning electron micrograph at 200× magnification of the material of FIG. 2c.

The sample was next held at a temperature of 1000° C. for 15 hours. The sample is shown in FIG. 2c at 80× magnification and in FIG. 2d at 200× magnification. The microchannels left by the silver wires are still present and intact.

EXAMPLE 2

Figure 3A:
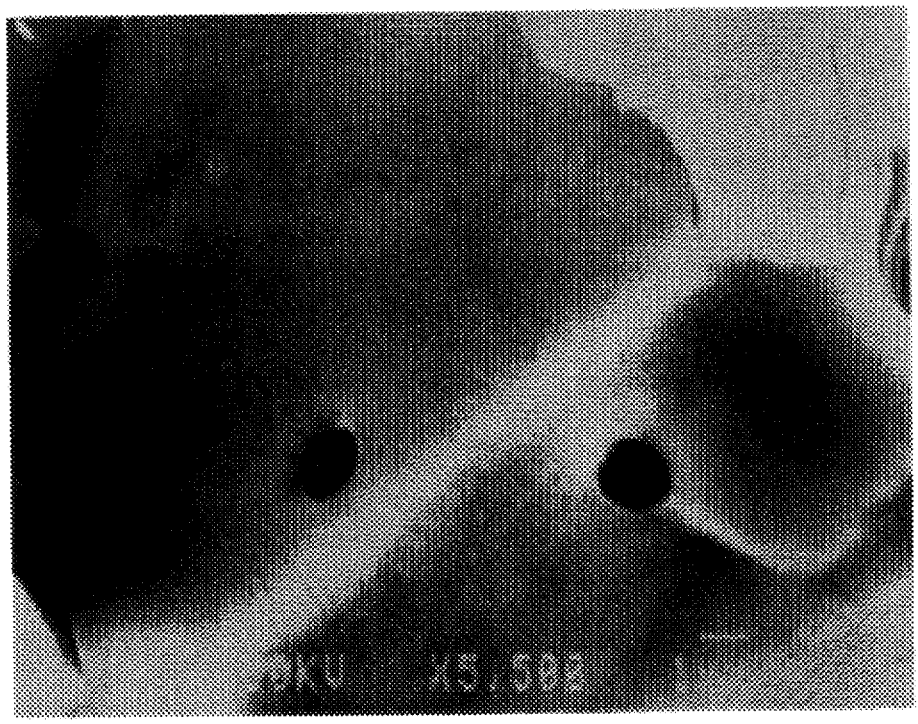
FIG. 3a is a scanning electron micrograph at 5,500× magnification of a further ceramic high $T_c$ superconducting material employing graphite fibers according to the present invention after heating at 920° C.
Figure 3B:
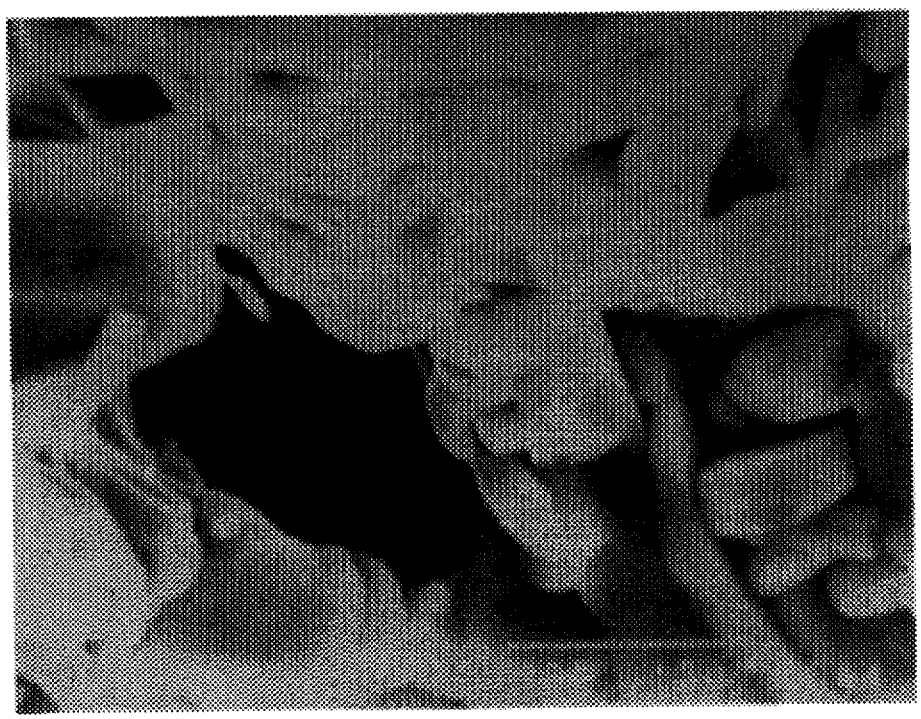

In another example, pyrolytic graphite fibers of 1 to 5 microns were embedded in a powder of the same $YBa_2Cu_3O_x$ composition as in Example 1. The powder was compacted and sintered at a temperature of 920° C. for 15 hours. After sintering, the graphite fibers had thermally decomposed, again leaving continuous tubular voids, as seen in the scanning electron micrographs shown in FIGS. 3a and 3b, at magnifications of 5,500× and 3,000× respectively. In this example, the tubular voids are smaller in diameter than the voids left by the silver wires. As can be seen in FIGS. 3a and 3b, the crystals of the superconducting material grew around the fibers, so that some voids pass through the grains, rather than between them. Such structure offers the possibility of improved intragranular oxidation.

The process of the present invention is most applicable to those superconductors in which oxygenation is anisotropic and diffusion is prohibitively slow along the thickness of a slab or ribbon, such as the class of superconductors designated by the general formula $RBa_2Cu_3O_x$, where R is one or more rare earth elements or yttrium and x ranges from 6 to 7. However, if desired, the process could be applied to other superconductors, such as the cuprate superconductors based on bismuth or thallium which may have magnetic moments provided by one or more rare earth constituents. Examples include $Bi_2Sr_2Ca_{1-x}R_xCu_2O_y$ (known as Bi-2212), or $Pb_{0.25}Tl_{0.75}Ba_2Ca_{3-x}R_xCu_4O_y$ (known as Tl-1234), where R is one or more rare earth elements and x ranges from 0.05 to 1.0 and preferably from 0.1 to 0.3.

The invention is not to be limited by what has been particularly shown and described, except as indicated by the appended claims.

We claim:

1. A process for oxygenation of a ceramic superconducting material selected from the group consisting of $RBa_2Cu_3O_x$, wherein R is one or more rare earth elements or yttrium, x ranges from 6 to 7, wherein said $RBa_2Cu_3O_x$ material has a higher current density in an a-b plane than along the c-axis perpendicular to the a-b plane, $Bi_2Sr_2(Ca_{1-x}R_x)_{n-1}Cu_nO_y$, wherein R is one or more rare earth elements, x ranges from 0.0 to 0.95, n=2 or 3, and y ranges from 8 to 10.5, depending on x and n, or $(Pb_xTl_{1-x})_mBa_2(Ca_{1-y}R_y)_{n-1}Cu_nO_z$ wherein R is one or more rare earth elements, x ranges from 0.0 to 0.95, m=1 or 2, y ranges from 0.0 to 0.95, n=2, 3, or 4, and z ranges from 5.10 to 14.4, depending on x, m, y and n, said process comprising:

providing said superconducting material;

forming a plurality of small diameter microchannels through the superconducting material by the addition of a plurality of wires or fibers of a thermally removable material within a slab or ribbon of said superconducting material, said thermally removable material comprising silver, an alloy of silver, silver-plated tungsten, or silver-plated molybdenum, and heating said slab or ribbon for a time and at a pressure and a temperature sufficient to cause the thermally removable material to melt, evaporate or burn thereby leaving microchannels in said slab or ribbon;

oxygenating the microchannel-containing superconducting slab or ribbon in an $O_2$-containing atmosphere for a time and at a pressure and a temperature sufficient to cause oxygen to be transported along said microchannels and to diffuse into the interior of said superconducting slab or ribbon.

2. The oxygenation process of claim 1, wherein said step of forming said plurality of microchannels comprises providing a plurality of wires or fibers of a thermally removable material within said superconducting material in a powdered form prior to forming said superconducting material into said slab or ribbon.

3. The oxygenation process of claim 1, wherein said step of forming said plurality of microchannels further comprises heating said slab or ribbon for a time and at a pressure and a temperature sufficient to cause said slab or ribbon in said powdered form to sinter.

4. The oxygenation process of claim 1, wherein said plurality of wires or fibers are provided as a mesh, a tow, or a brush.

5. The oxygenation process of claim 1, wherein said wires or fibers have a diameter of at least 1 micron.

6. The oxygenation process of claim 1, wherein said wires or fibers are spaced apart by a distance four to six times a diameter of said wires or fibers.

7. The oxygenation process of claim 1, wherein said step of forming said slab or ribbon further comprises providing said superconductor material in a particulate form and forming said particulate form into said slab or ribbon.

8. The oxygenation process of claim 1, wherein said slab or ribbon is oriented to lie in the a-b plane, said slab further having a thickness in a direction along the c-axis perpendicular to the a-b plane, at least a portion of said microchannels oriented generally parallel to the c-axis.

9. The oxygenation process of claim 1, wherein at least one-third of said plurality of microchannels are oriented generally parallel to the c-axis.

10. The oxygenation process of claim 1, wherein said step of forming said slab or ribbon further comprises orienting said superconductor material to align crystals of said material to carry current in the a-b plane.

11. The oxygenation process of claim 1 wherein said step of forming said slab or ribbon comprises providing a magnetic field to orient said superconductor material along an axis in the a-b plane.

12. The process of claim 1, wherein the alloy of silver comprises a silver-copper alloy, a silver-palladium alloy, a silver-gold alloy, or a silver-platinum alloy.

13. The oxygenation process of claim 1, wherein said step of forming said plurality of microchannels comprises providing a plurality of wires or fibers of a thermally removable material within said superconducting material in an unconsolidated form prior to forming said superconducting material into said slab or ribbon.

14. A process for oxygenation of a ceramic superconducting material selected from the group consisting of $RBa_2Cu_3O_x$, where R is one or more rare earth elements or yttrium, x ranges from 6 to 7, wherein said $RBa_2Cu_3O_x$ material has a higher current density in an a-b plane than along the c-axis perpendicular to the a-b plane, $Bi_2Sr_2(Ca_{1-x}R_x)_{n-1}Cu_nO_y$, wherein R is one or more rare earth elements, x ranges from 0.0 to 0.95, n=2 or 3, and y ranges from 8 to 10.5, depending on x and n, or $(Pb_xTl_{1-x})_mBa_2(Ca_{1-y}R_y)_{n-1}Cu_nO_z$ wherein R is one or more rare earth elements, x ranges from 0.0 to 0.95, m=1 or 2, y ranges from 0.0 to 0.95, n=2, 3, or 4, and z ranges from 5.10 to 14.4, depending on x, m, y and n, said process comprising:

forming a slab or ribbon of said superconducting material;

forming a plurality of small diameter microchannels through said superconducting material by laser drilling, electron beam drilling, ultrasonic drilling, electrolytic etching, or punching; and oxygenating the microchannel-containing superconducting slab or ribbon in an $O_2$-containing atmosphere for a time and at a pressure and a temperature sufficient to cause oxygen to be transported along said microchannels and to diffuse into the interior of said superconducting slab or ribbon.

15. The oxygenation process of claim 14, wherein said slab or ribbon is oriented to lie in an a-b plane, said slab further having a thickness in a direction along a c-axis perpendicular to the a-b plane, at least a portion of said microchannels oriented generally parallel to the c-axis.

16. The oxygenation process of claim 14, wherein said microchannels have a diameter of at least 1 micron.

17. The oxygenation process of claim 14, wherein said microchannels are spaced apart by a distance four to six times a diameter of said microchannels.

18. The oxygenation process of claim 1 wherein said step of forming said slab or ribbon comprises providing a magnetic field to orient said superconductor material along an axis in the a-b plane.

* * * * *